(12) United States Patent
Boissonnet et al.

(10) Patent No.: US 7,015,105 B2
(45) Date of Patent: Mar. 21, 2006

(54) METHOD OF SIMULTANEOUSLY MAKING A PAIR OF TRANSISTORS WITH INSULATED GATES HAVING RESPECTIVELY A THIN OXIDE AND A THICK OXIDE, AND CORRESPONDING INTEGRATED CIRCUIT COMPRISING SUCH A PAIR OF TRANSISTORS

(75) Inventors: Laurence Boissonnet, La Tranche (FR); Dominique Golanski, Grenoble (FR); Bruno Rauber, Goncelin (FR); Andre Granier, Barraux (FR)

(73) Assignee: STMicroelectronics, S.A., Montrouge (FR)

( * ) Notice: Subject to any disclaimer, the term of this patent is extended or adjusted under 35 U.S.C. 154(b) by 101 days.

(21) Appl. No.: 10/169,237

(22) PCT Filed: Oct. 26, 2001

(86) PCT No.: PCT/FR01/03343

§ 371 (c)(1),
(2), (4) Date: Jun. 27, 2002

(87) PCT Pub. No.: WO02/37560

PCT Pub. Date: May 10, 2002

(65) Prior Publication Data

US 2003/0155618 A1  Aug. 21, 2003

(30) Foreign Application Priority Data

Oct. 30, 2000  (FR) ................................. 00 13949

(51) Int. Cl.
*H01L 21/8234* (2006.01)
(52) U.S. Cl. ..................................... 438/275; 438/301
(58) Field of Classification Search ............... 257/392, 257/408, 344; 438/275, 301, 302, 303, 305, 438/307
See application file for complete search history.

(56) References Cited

U.S. PATENT DOCUMENTS 6,157,062 A * 12/2000 Vasanth et al. ............. 257/336

FOREIGN PATENT DOCUMENTS

JP     7-193200     *   7/1995

OTHER PUBLICATIONS

English language translation of Japanese Kokai 7-193200.*

* cited by examiner

*Primary Examiner*—Mark V. Prenty
(74) *Attorney, Agent, or Firm*—Lisa K. Jorgenson; Jon A. Gibbons; Fleit, Kain, Gibbons, Gutman, Bongini & Bianco P.L.

(57) ABSTRACT

A method of simultaneously fabricating a pair of insulated gate transistors respectively having a thin oxide and a thick oxide, and an integrated circuit including a pair of transistors of this kind. Forming low-doped NLDD areas of the thin oxide second transistor includes implanting a first dopant having a first concentration and implanting a second dopant having a second concentration lower than the first concentration. Forming low-doped areas NLDD of the first, thick oxide transistor includes only said implantation of the second dopant.

9 Claims, 7 Drawing Sheets

Figure 1:
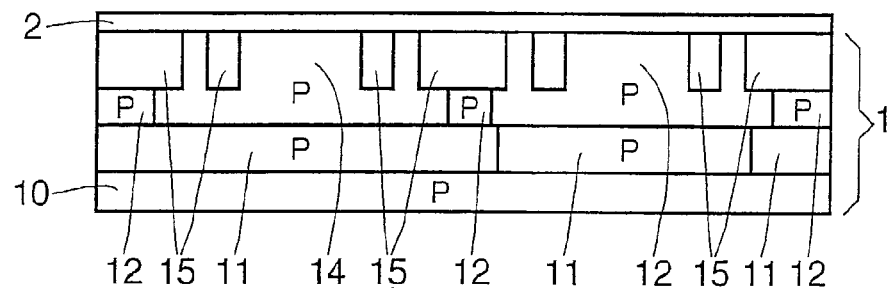

METHOD OF SIMULTANEOUSLY MAKING A PAIR OF TRANSISTORS WITH INSULATED GATES HAVING RESPECTIVELY A THIN OXIDE AND A THICK OXIDE, AND CORRESPONDING INTEGRATED CIRCUIT COMPRISING SUCH A PAIR OF TRANSISTORS

CROSS REFERENCE TO RELATED APPLICATIONS

This application is a national state entry of application PCT/FR01/03343 filed on Oct. 26, 2001, which is based upon and claims priority from prior French Patent Application No. 0013949, filed Oct. 30, 2000, the disclosure of each application which is hereby incorporated by reference individually in its entirety.

The invention relates to microelectronics, in particular to fabricating integrated circuits, and more particularly to fabricating a pair of insulated gate transistors simultaneously by a process known in the art as the "double gate oxide" process.

The "double gate oxide" process forms simultaneously a first transistor having a thick gate oxide layer, for example a layer having a thickness of the order of 120 Å, and a second transistor having a thin gate oxide layer (i.e. a layer thinner than the gate oxide of the first transistor), for example a layer having a thickness of the order of 50 Å.

A thin oxide transistor can be used to implement logic functions. A thick oxide transistor operates at higher voltages than thin oxide transistors, for example 5 volts, and can be used to implement analog functions.

The skilled person knows that an insulated gate transistor has high-doped drain and source regions and low-doped source and drain (Low Doped Drain—LDD) areas extending under the lateral insulative regions (spacers) of the transistor between the high-doped drain and source regions and the channel region of the transistor. The thin oxide transistor requires an abrupt transition between the low-doped source and drain area and the channel region to reduce its input/output resistance and short channel effects.

However, in the gate double oxide process usually employed, the low-doped source and drain areas are implanted not only for the thin oxide transistor but also for the thick oxide transistor. For the thick oxide transistor, operating at higher voltages, the sudden transition caused by implanting the low-doped source and drain regions causes a problem of leakage in the turned off state, known as gate-induced drain leakage (GIDL), and a reliability problem (hot carriers).

The invention aims to provide a solution to this problem.

The invention aims to improve the "gate double oxide" process so that a thin oxide transistor and a thick oxide transistor can be made simultaneously without degrading the performance of the thin oxide transistor and which improves the performance of the thick oxide transistor in terms of gate-induced drain linkage (GIDL) and reliability.

Another object of the invention is to offer this improvement at reduced cost.

The invention therefore proposes a method of simultaneously fabricating a pair of insulated gate transistors, a first transistor of the pair having a thicker gate oxide layer than the second transistor of the pair. The method includes, for each transistor, forming the gate oxide layer, forming the gate flanked by insulative lateral regions, forming high-doped drain and source regions, and forming low-doped source and drain areas extending under the insulative lateral regions between the high-doped drain and source regions and the channel region of the transistor.

According to one general feature of the invention, forming source and drain areas of the second transistor (i.e. the thin oxide transistor) includes implanting a first dopant having a first concentration and implanting a second dopant having a second concentration lower than the first concentration. Also, forming the source and drain areas of the first transistor (i.e. the thick oxide transistor) includes only implanting the second dopant.

In one embodiment of the method, the first dopant is implanted on either side of the gate of the second transistor (thin oxide transistor) before forming the insulative lateral regions, the active area of the first transistor (thick oxide transistor) being protected by a layer of resin. The second dopant is implanted obliquely, for example at 45°, and simultaneously from either side of insulative lateral regions associated with the gates of the two transistors.

The first and second transistors can both be N-channel transistors (NMOS transistors). In this case the first dopant can be arsenic and the second dopant can be phosphorus. Both dopants can be arsenic, however.

If phosphorus and arsenic are used, for example, the phosphorus NLDD junction of the thick gate oxide transistor is gradual and the NLDD junction of the thin gate oxide transistor, consisting of phosphorus and arsenic, is still abrupt.

The first and second transistors can equally well be P-channel transistors (PMOS transistors). In this case the first dopant and the second dopant are advantageously the same and consist of boron.

The invention also provides an integrated circuit including at least one pair of insulated gate transistors fabricated by the above method.

Other advantages and features of the invention will become apparent on reading the following description of non-limiting embodiments of the invention and from the accompanying drawings, in which FIGS. 1 to 15 show diagrammatically the principal steps of one embodiment of a process according to the invention for obtaining a pair of transistors according to the invention.

FIG. 1 shows an initial silicon substrate 10, for example a P-type substrate.

Buried P-type layers 11 have been formed in the substrate 10 by a conventional manner known in the art.

An N silicon layer has then been grown epitaxially, again in a conventional manner known in the art, and etched locally to form trenches. Insulative regions 15 are obtained after filling the trenches with an oxide and polishing mechanically and chemically.

After protecting the future active area of the thick oxide transistor with a layer of resin, conventional boron implantation has formed a P-type well 13 and P-type channel stops 12.

After protecting the wells 13 with a layer of resin, further P-type implantation in the active area of the future thick oxide transistor has produced another well 14. This implantation step, which is very familiar to the skilled person, adjusts the threshold voltage of the future thick oxide transistor to a relatively low value.

All the steps outlined above are very familiar to the skilled person and yield a substrate 1.

A first oxide layer 2, for example a layer of silicon oxide, approximately 100 Å thick is then grown on the top surface of the substrate 1.

Figure 2:
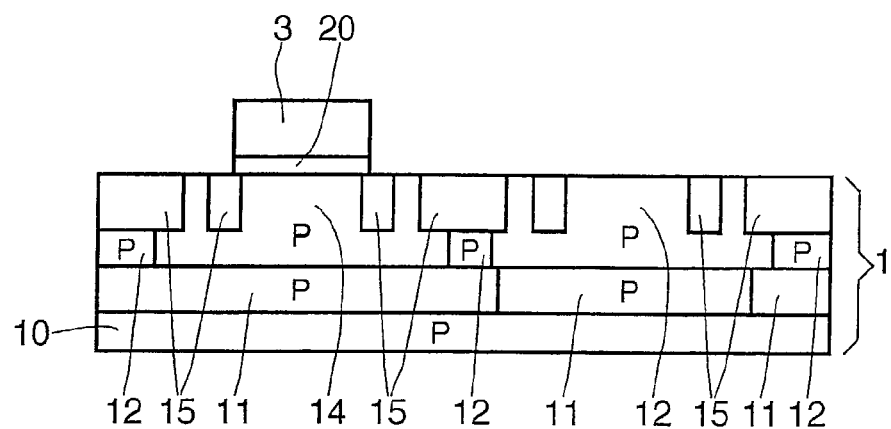
Figure 3:
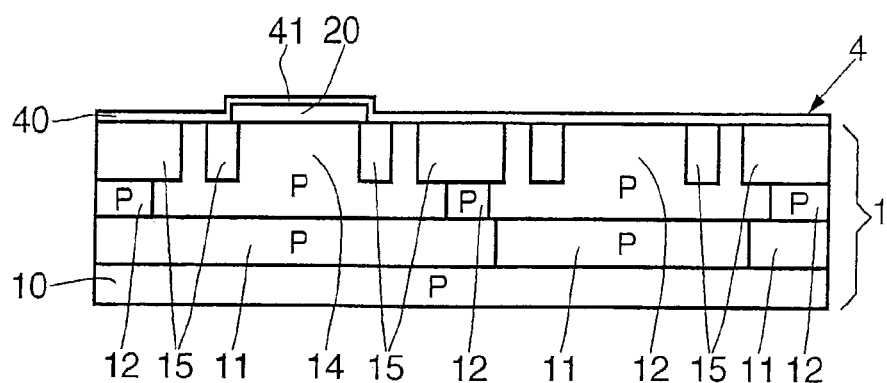

After protecting the part 20 of the oxide layer 2 situated above the well 14 between the two insulative areas 15 with a block 3 of resin, the layer 2 is then partially etched, as shown in FIG. 2.

After removing the resin block 3 (FIG. 3), a 50 Å thick second oxide layer 4 (for example of $SiO_2$) is grown on the top surface of the substrate 1 and on the top surface of the residual portion 20 of the oxide layer 2.

Growing the oxide layer 4 on the top surface of the silicon produces a portion 40 which is 50 Å thick. Growing the layer 4 on the residual portion 20 of silicon dioxide produces a portion 41 of silicon dioxide which is only about 20 Å thick.

The thickness of the gate oxide 2041 above the well 14 (FIG. 4) is therefore approximately 120 Å. The gate oxide 40 above the well 13 has a thickness of the order of 50 Å.

Figure 4:
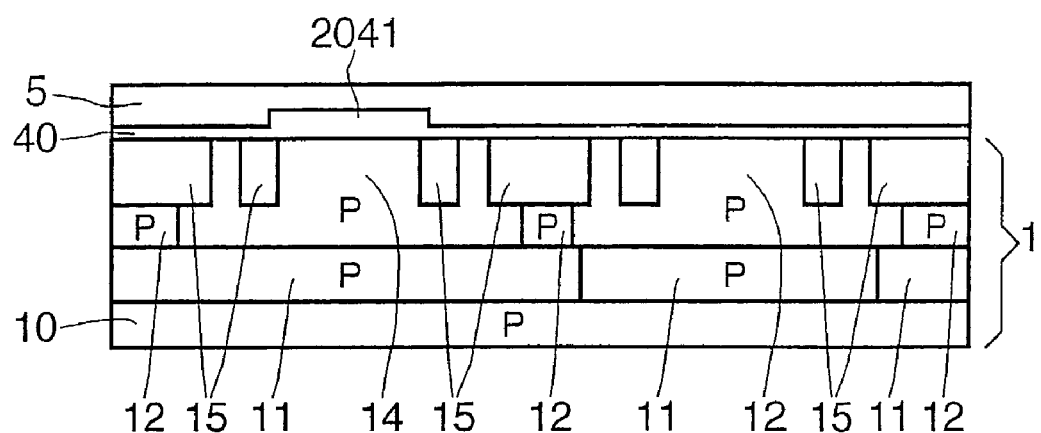
Figure 5:
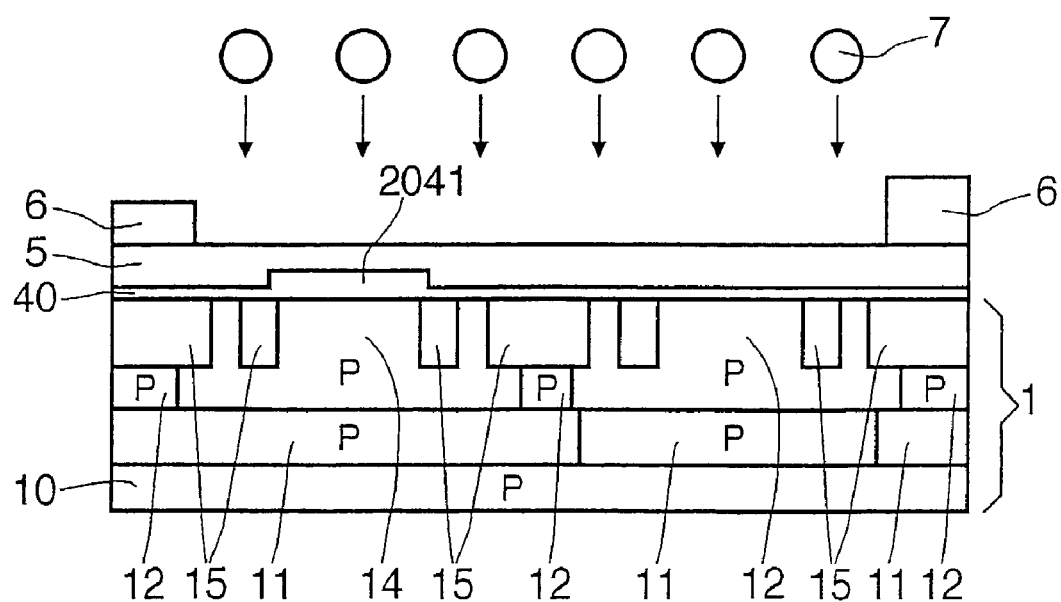

A polysilicon layer 5 is then deposited to form the future gates of the two transistors in a conventional manner known in the art (FIG. 4).

After applying a resin mask 6 to protect the remainder of the semiconductor wafer, the gate 5 is pre-implanted with polysilicon 7 so that the conductivity of the gate material conforms to the type of transistor to be made. In other words, in this instance, because the aim is to make two N-channel transistors (NMOS transistors), the gate material is doped with arsenic, for example, to confer N-type conductivity on it.

Figure 6:
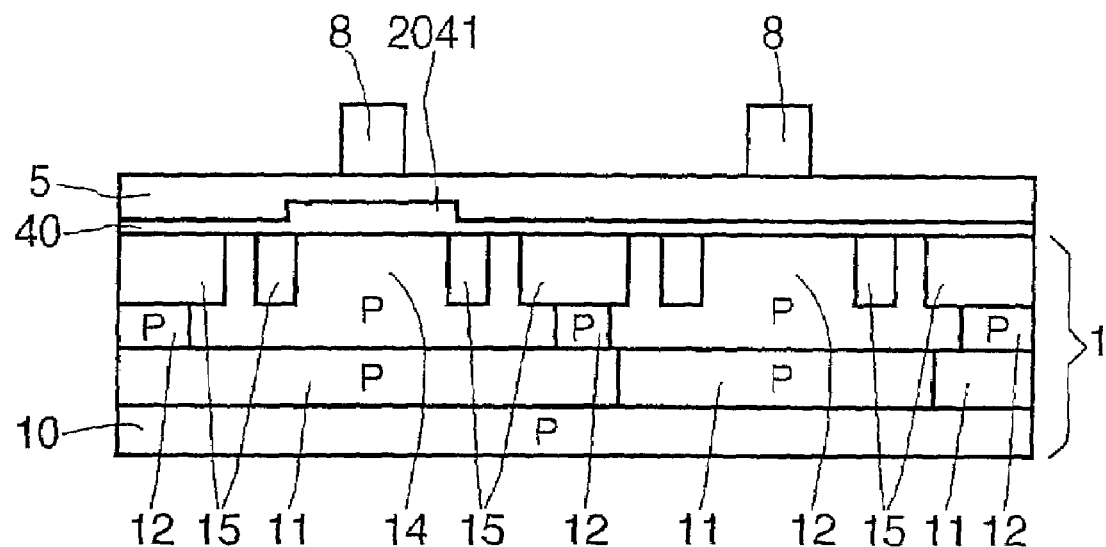
Figure 7:
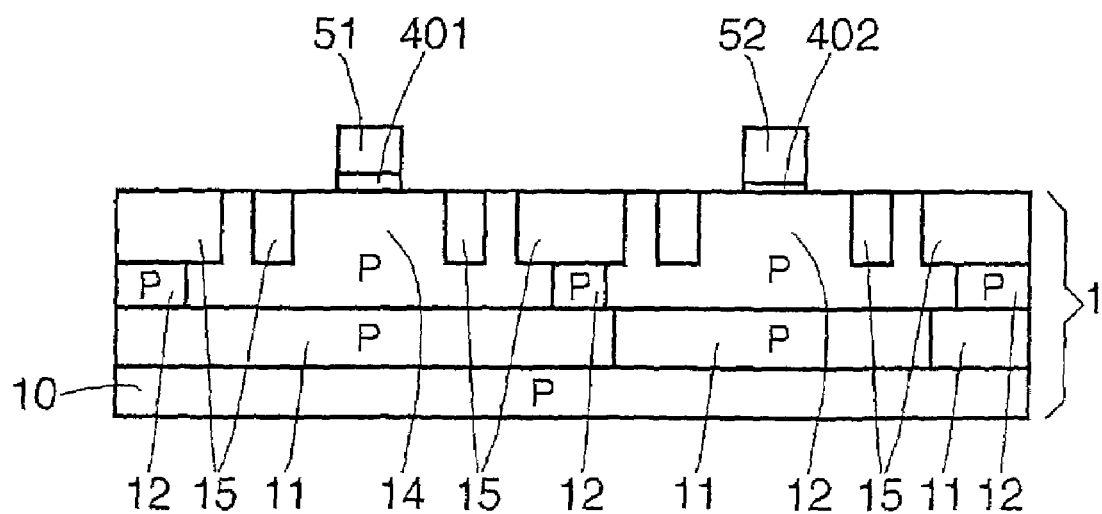

The geometry of the future gates of the two transistors is then defined using two resin blocks 8 in a conventional way known in the art (FIG. 6). The polysilicon layer 5 is then etched on either side of the resin blocks 8 until the top surface of the substrate 1 is reached, as shown in FIG. 7, to form the gate 51 of the future transistor T1 with a thick oxide layer 401 and the gate 52 of the future transistor T2 with a thin oxide layer 402.

Figure 8:
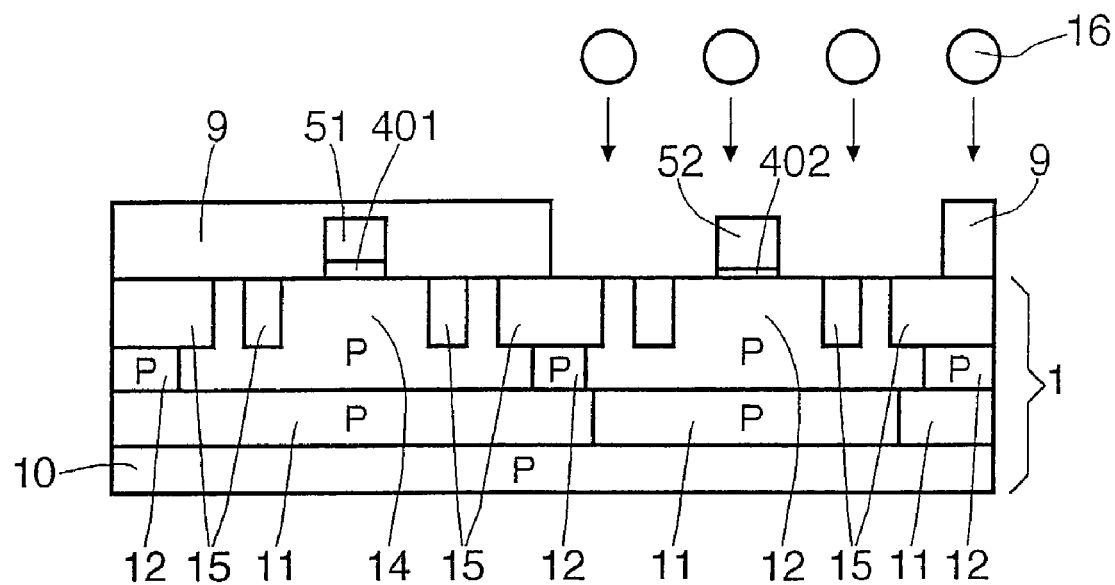
Figure 9:
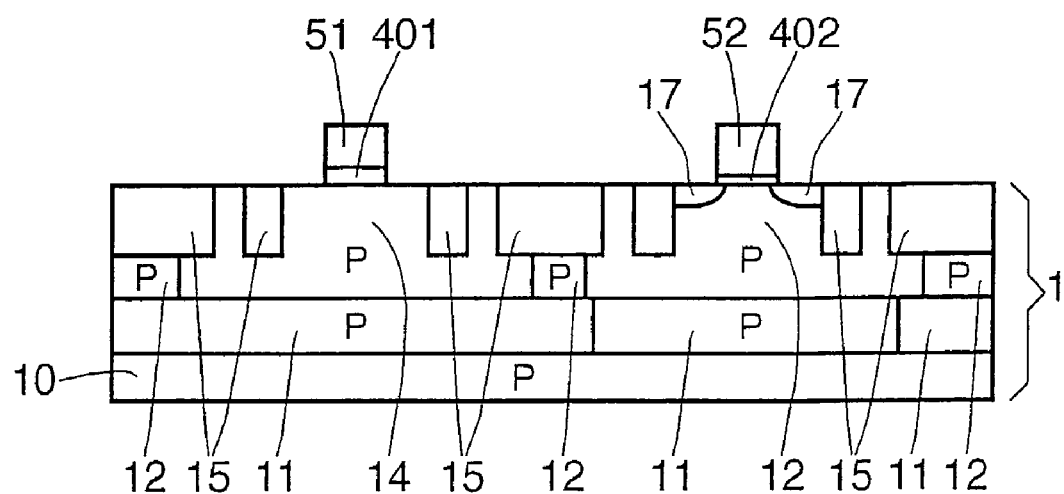
Figure 10:
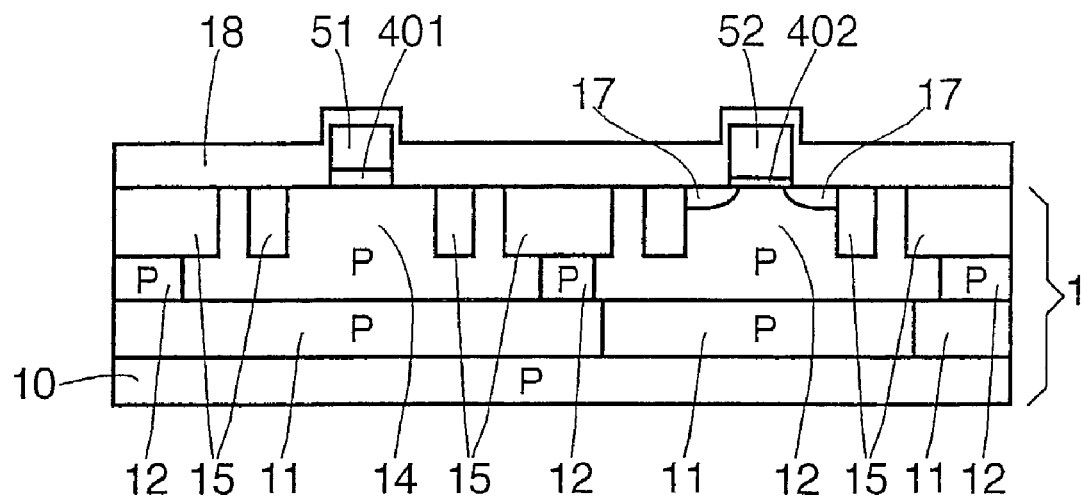
Figure 11:
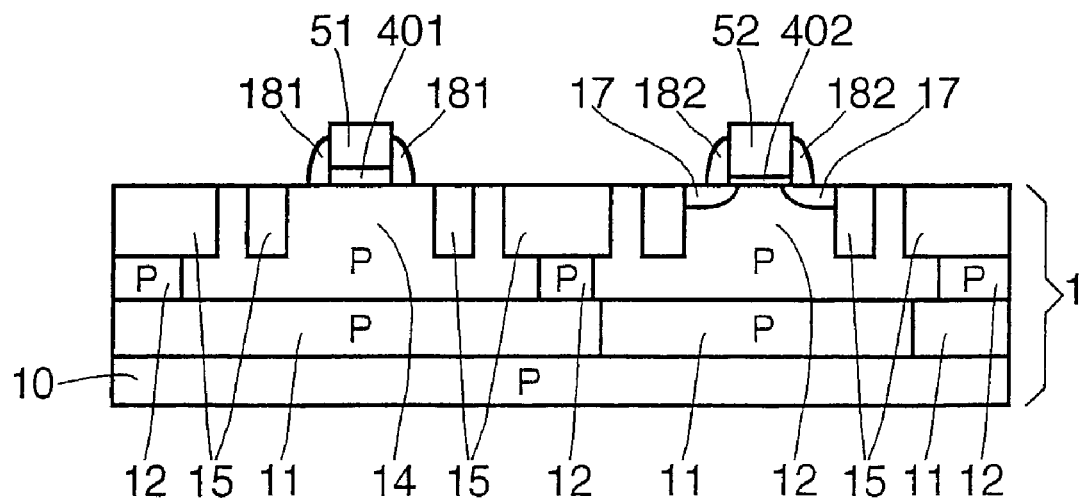
Figure 12:
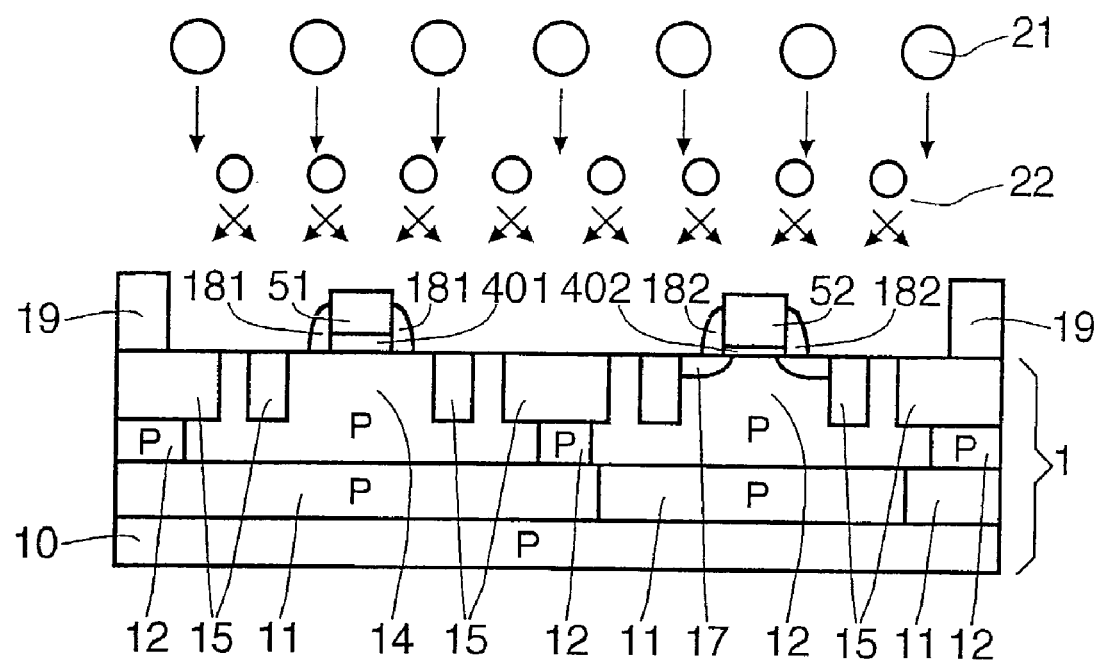

A first dopant 16 with a first concentration is then implanted in the well 13 and in particular on either side of the gate 52 (FIGS. 8 and 9). Implanting the first dopant contributes to forming the low-doped source and drain areas of the future oxide transistor 20. N-type implantation is used in the case of an NMOS transistor (NLDD implantation). The first dopant 16 is therefore arsenic As, for example. The concentration used is $2 \times 10^{14}$ $cm^{-2}$ and the implantation is effected at an energy of 50 keV.

Note that the first dopant 16 is implanted before forming the insulative lateral regions (spacers) of the thin oxide transistor. Also, the active area of the other (thick oxide) transistor is protected during implantation by a resin layer 9.

After removing the resin layer 9, the configuration shown in FIG. 9 is obtained; FIG. 9 shows the low-doped implanted areas 17 of the future thin oxide transistor; note the absence at this stage of low-doped areas on either side of the gate 51 of the future thick oxide transistor.

A stack of insulative layers 18 formed of tetraethyl orthosilicate (TEOS), for example, is then deposited in a conventional manner that is known in the art (FIG. 10) to a thickness of the order 200 Å, for example, surmounted by a layer of silicon nitride with a thickness of 800 Å, for example.

Etching the stack of layers 18 produces a gate 51 flanked by spacers 181 and a gate 52 flanked by spacers 182.

After applying a layer of resin 19 to protect the remainder of the wafer, conventional implantation 21 is then carried out (FIG. 12) to form the high-doped drain and source regions of the two transistors. The implantation 21, intended to impart N$^+$ conductivity to the source and drain regions, is effected with arsenic at a concentration of $4 \times 10^{15}$ $cm^{-2}$ and at an energy of 60 keV, for example.

A second dopant 22 is then implanted simultaneously on both sides of the insulative lateral regions (spacers) 181 and 182 associated with the gates 51 and 52 of the future transistors.

Although the second dopant can also be arsenic, it has been noted that phosphorus is preferable for obtaining the effect that the present invention seeks to obtain, as it provides a less abrupt transition than arsenic. The concentration of the second dopant 22 is of the order of $10^{13}$ $cm^{-2}$, for example. Implantation is carried out at an energy of 40 keV or less, for example.

The skilled person will have noted that implantation with the second dopant forms the low-doped source and drain areas of the thick oxide transistor T1. Because the implantation is effected on both sides of the spacers 181 in particular, it is oblique to enable the low-doped areas to extend under the spacers 181 of the transistor T1.

Note also that the implantation step 22 could have been carried out before the implantation step 21.

Figure 13:
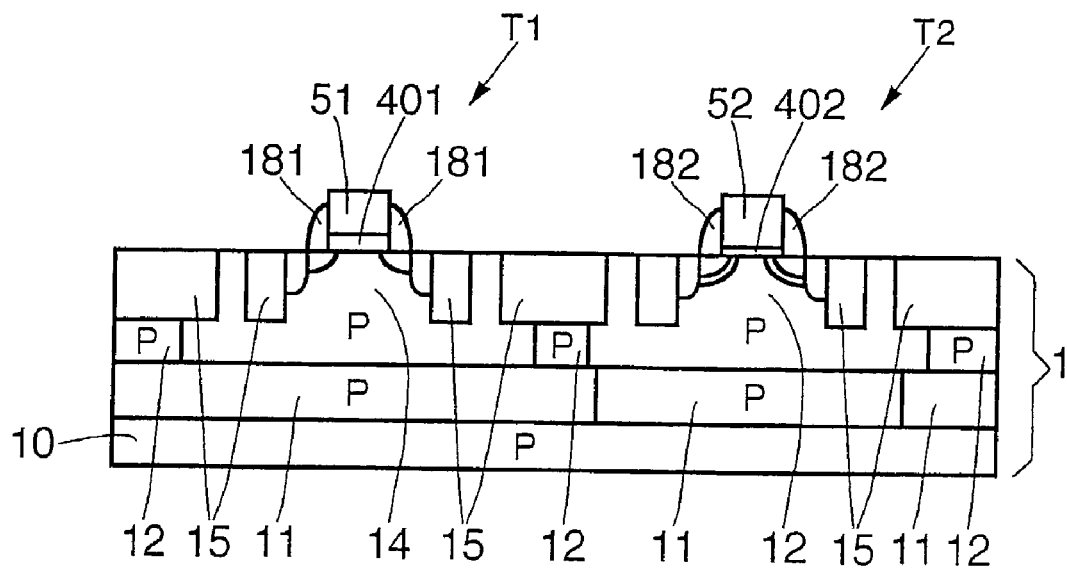
Figure 14:
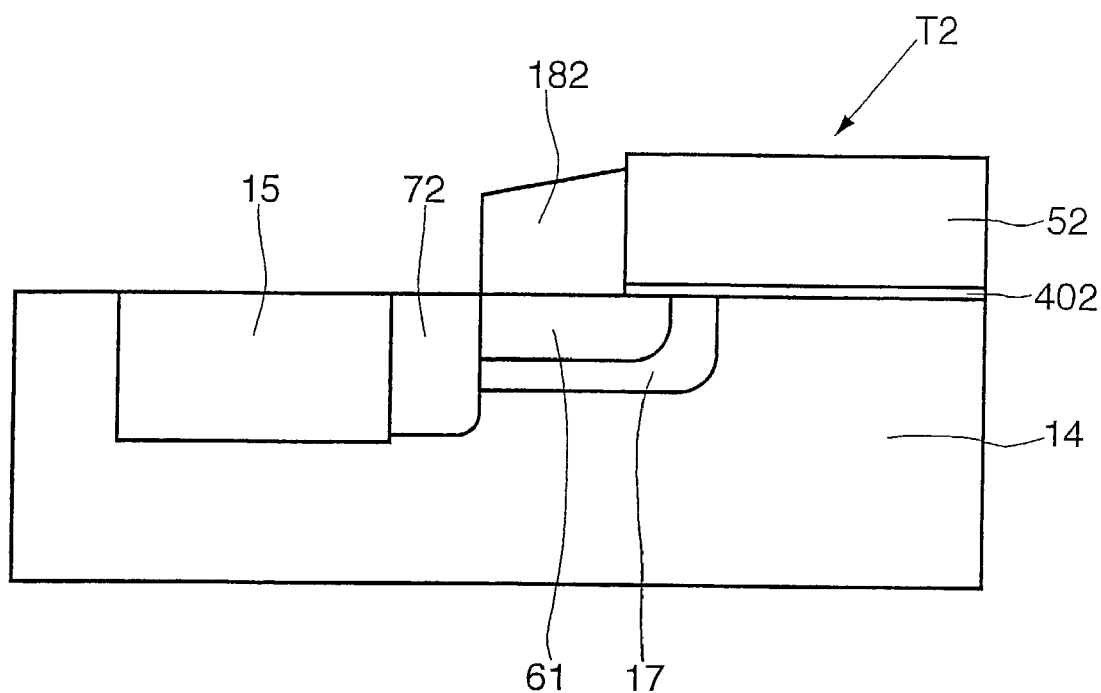

When the resin mask 19 is removed, the two transistors T1 and T2 shown in FIG. 13 are obtained; the compositions of their low-doped source and drain areas and their high-doped source and drain regions will now be described in more detail, with particular reference to FIGS. 14 and 15.

Figure 15:
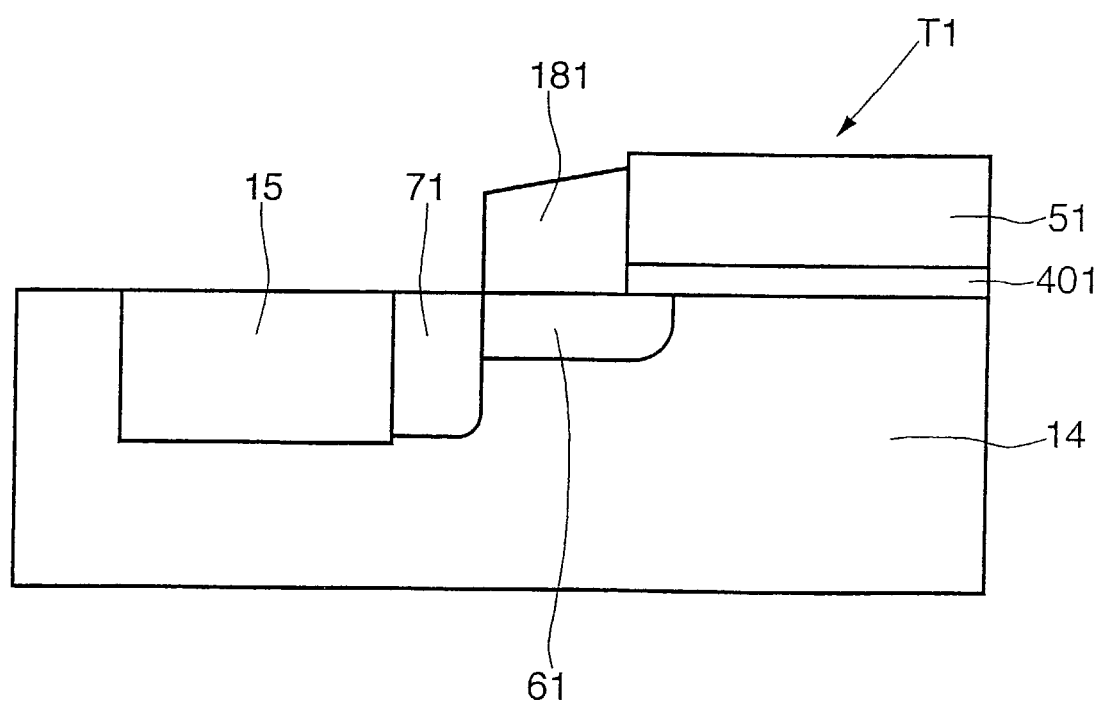

As shown in FIG. 15, the low-doped source and drain areas of the thick oxide transistor T1 are formed from the area 61 implanted with phosphorus. The area 61 is extended outside the spacer 181 by the N$^+$ region 21 highly doped with arsenic.

As for the thin oxide transistor T2 (FIG. 14), the N$^+$ drain and source region 72 highly doped with arsenic is extended under the spacer and under the gate by the low-doped source and drain areas that here consist of the arsenic-doped area 17 and the additional implantation of phosphorus 61.

The method according to the invention therefore produces a thick gate oxide transistor and a thin gate oxide transistor simultaneously, producing a gradual NLDD junction in the low-doped source and drain areas for the thick oxide transistor and retaining an abrupt NLDD transition for the thin gate oxide transistor. The additional implantation of phosphorus 61 does not alter the abrupt nature of the transition obtained by the arsenic implanting step 17.

Although with a conventional double gate oxide process a high leakage current would be observed in the turned off state (zero gate voltage) and with a drain voltage of 5 V, there is now no leakage current at a drain voltage of 5 V in a thick oxide transistor obtained by the improved double gate oxide process of the invention. The onset of a leakage current is pushed back for a drain voltage in the turned off state of at least 7 V.

The invention is not limited to the embodiments described, but encompasses all variants thereof.

It would therefore have been possible, at the stage of the process shown in FIG. 8, to free the well 14 as well and to implant the second dopant (for example phosphorus at a low concentration) directly to form the low-doped drain and source areas of the thick oxide transistor at this stage. At this time, of course, the implantation would have to be oblique because it would be effected before forming the spacers. However, an embodiment of this kind would have subsequently necessitated an additional resin mask to mask the well 14 of the thick oxide transistor to perform the arsenic implantation 16 at a higher dose, completing the formation of the low-doped source and drain areas of the thin oxide transistor.

The embodiment shown in FIG. 8 therefore has the considerable advantage of not requiring the use of an additional reticle and an additional specific masking step to make the two transistors simultaneously. At the FIG. 8 stage, it is merely necessary to modify the design of the mask, to extend it at the level of the caisson 14; the mask, usually employed in a CMOS fabrication method, and known to the skilled person as an "NLDD mask", protects the other areas of the wafer that are not to be implanted.

Finally, although the invention is described in detail here for N-channel transistors, it also applies to the simultaneous production of P-channel transistors. The skilled person will know how to make the necessary modifications as to the conductivity types of the various buried layers and wells to be used.

What is more, in the case of producing P-type transistors, the first dopant 16 and the second dopant 22 can be boron, for example.

What is claimed is:

1. A method for simultaneously fabricating a pair of insulated gate transistors comprising a first transistor having a thicker gate oxide layer than a second transistor, for each of the first and the second transistor in the pair of insulated gate transistors, the method comprising:
    forming at least one gate oxide layer;
    forming at least one gate flanked by one or more insulative lateral regions;
    forming at least one high-doped drain;
    forming one or more source regions;
    forming at least one low-doped source area and a drain area extending under the insulative lateral regions between the high-doped drain and the one or more source regions;
    wherein the step of forming at least one low-doped source area and a drain area for a second transistor includes forming at least one low-doped source area and a drain area by implanting a first dopant having a first concentration and implanting a second dopant having a second concentration lower than the first concentration;
    wherein the step of forming at least one low-doped source area and a drain area for a first transistor includes forming a low-doped source and a drain by implanting the second dopant and by not implanting the first dopant; and
    wherein the step of forming at least one gate flanked by one or more insulative regions includes implanting the first dopant on either side of the gate of the second transistor prior to forming the insulative lateral regions, and whereby an active area of the first transistor is protected by a layer of resin.

2. The method according to claim 1, wherein the step of forming at least one gate flanked by one or more insulative regions includes implanting a second dopant obliquely and simultaneously from either side of the insulative lateral regions of each of the first transistor and the second transistor.

3. The method according to claim 1, characterized in that the first transistor and the second transistor are N-channel transistors and in that the first dopant is arsenic and the second dopant is phosphorus.

4. The method according to claim 1, characterized in that the first transistor and second transistor are P-channel transistors and in that the first dopant and the second dopant are boron.

5. The method according to claim 1, wherein the step of forming at least one low-doped source area and drain areas for a second transistor includes implanting a second dopant having a second concentration in the order of $10^{13}$ cm$^{-2}$.

6. The method according to claim 5, wherein the step of forming at least one low-doped source area and drain areas for a second transistor includes implanting a second dopant carried out at an energy of 40 keV or less.

7. The method according to claim 1, wherein the step of forming at least one low-doped source area and a drain area for a second transistor includes implanting a first dopant having a first concentration in the order of $2\times10^{14}$ cm$^{-2}$.

8. The method according to claim 7, wherein the step of forming at least one low-doped source area and a drain area for a second transistor includes implanting a first dopant at an energy of 50 keV .

9. A method for simultaneously fabricating a pair of insulated gate transistors comprising a first transistor having a thicker gate oxide layer than a second transistor, the method comprising:
    forming for a first transistor and a second transistor;
        at least one gate oxide layer;
        at least one gate flanked by insulative lateral regions, whereby the insulative regions includes implanting a first dopant on either side of the gate of the second transistor prior to forming the insulative lateral regions, and whereby an active area of the first transistor is protected by a layer of resin;
        at least one high-doped drain and one or more source regions;
    at least one low-doped source area and a drain area extending under the insulative lateral regions between the high-doped drain and the one or more source regions by implanting the first dopant having a first concentration and implanting a second dopant having a second concentration lower than the first concentration for the second transistor; and
    at least one low-doped source area and drain area extending under the insulative lateral regions between the high-doped drain and the one or more source regions by implanting the second dopant and by not implanting the first dopant for the first transistor.

* * * * *

UNITED STATES PATENT AND TRADEMARK OFFICE
CERTIFICATE OF CORRECTION

PATENT NO. : 7,015,105 B2
APPLICATION NO. : 10/169237
DATED : March 21, 2006
INVENTOR(S) : Laurence Boissonnet et al.

It is certified that error appears in the above-identified patent and that said Letters Patent is hereby corrected as shown below:

On the Title page, item #75 please change "Laurence Boissonnet, La Tranche" to -- Laurence Boissonnet, Grenoble --

Signed and Sealed this

Twenty-second Day of May, 2007

JON W. DUDAS
*Director of the United States Patent and Trademark Office*